United States Patent [19]

Toyoda et al.

[11] 4,373,195
[45] Feb. 8, 1983

[54] SEMICONDUCTOR INTEGRATED CIRCUIT DEVICE

[75] Inventors: Kazuhiro Toyoda, Yokohama; Chikai Ono, Kawasaki; Toshio Hayashi, Iruma, all of Japan

[73] Assignee: Fujitsu Limited, Kawasaki, Japan

[21] Appl. No.: 200,217

[22] Filed: Oct. 24, 1980

[30] Foreign Application Priority Data

Oct. 30, 1979 [JP] Japan .............. 54-140087

[51] Int. Cl.³ .............. G11C 11/40
[52] U.S. Cl. .............. 365/154
[58] Field of Search .............. 365/154, 174, 175, 179

[56] References Cited

U.S. PATENT DOCUMENTS 4,314,359  2/1982  Kato et al. .............. 365/179

Primary Examiner—Terrell W. Fears
Attorney, Agent, or Firm—Staas & Halsey

[57] ABSTRACT

A semiconductor integrated circuit device of an I²L type is disclosed. In this device, in order to clamp the potentials of bit lines at a desired level, a bit line clamp circuit comprising at least one dummy cell for which the fluctuation of characteristics induced by manufacturing processes are relative to those of the memory cells of an I²L type is provided.

11 Claims, 13 Drawing Figures

SEMICONDUCTOR INTEGRATED CIRCUIT DEVICE

BACKGROUND OF THE INVENTION (1) Field of the Invention

The present invention relates to a semiconductor device and, more particularly, to a semiconductor integrated circuit device in which memory cells are of an I²L (which is an abbreviation for Integrated Injection Logic) type.

(2) Description of the Prior Art

In general, each of the memory cells of a bipolar memory device comprises a pair of load resistors connected to one word line, a pair of cross-coupled transistors which serve as a flip-flop, connected to the load resistors, respectively, to one hold line which forms a word line pair with said word line and to a pair of bit lines. In the bipolar memory cells, the resistance value of the load resistors is very large so as to reduce the power consumption thereof. Therefore, the area the load resistors occupy in a chip is very large, and in addition, isolation between the cross-coupled transistors is required. Consequently, the bipolar memory cells are large in size. This results in a low integration density, and, therefore, a high manufacturing cost of the bipolar memory device.

In recent years, an I²L memory device has been developed. In an I²L memory cell, a pair of load transistors which serve as injectors are used instead of the above-mentioned large load resistors and, in addition, no isolation between transistors within a row is required. As a result, a high integration density and a low manufacturing cost can be attained. It should be noted that, such an I²L memory device can be manufactured by using conventional bipolar technology.

Usually, one I²L memory cell comprises a pair of first and second transistors of a first conduction type, such as a pnp type, which serve as injectors, a pair of cross-coupled third and fourth transistors of a second conduction type, such as an npn type, which serve as a flip-flop and a pair of fifth and sixth transistors of the second conduction type for detecting or reversing the state of the flip-flop in a read-out or write mode, respectively. The third and fourth transistors are always in the reverse conducting mode, in other words, the emitters and collectors of these transistors are used as collectors and emitters, respectively. In addition, when the memory cell is non-selected, the fifth and sixth transistors are also in the reverse conducting mode. Contrary to this, when the memory cell is selected, the fifth and sixth transistors are in the forward conducting mode.

In the above-mentioned I²L memory cell, one of either the third or fourth transistors is conductive, while the other is non-conductive. If the third transistor is conductive, injection currents of the first and second transistors are supplied to the collector (structurally shown as the emitter) and to the base of the third transistor, respectively. In order to change the cell information, the third transistor must be changed to non-conductive. This is done by supplying an emitter current larger than the write threshold current $I_{wth}$, and therefore, by bypassing the base current of the third transistor to the base current of the fifth transistor cross-coupled to the third transistor. In this case, the write threshold current $I_{wth}$ depends on the total injection current $I_{inj}$ which flows through a common emitter of the first and second transistors. In other words, when the injection current $I_{inj}$ is large, the write threshold current $I_{wth}$ is also large.

On the other hand, sink currents, which are explained in more detail below, flow from a selected memory cell directly to non-selected memory cells. The sink currents increase the injection current $I_{inj}$ of the selected memory cell and, accordingly, increase the write threshold current $I_{wth}$, so that the speed of the write operation becomes low.

In order to decrease the sink currents flowing from a selected memory cell into non-selected memory cells, one conventional I²L memory device comprises a bit line clamp circuit. The clamp circuit comprises a plurality of pairs of clamp transistors, each pair connected to each of the pairs of bit lines. Usually, a definite voltage is applied to the bases of the clamp transistors so that sink currents of non-selected memory cells are supplied from the clamp transistors, not from the selected memory cell. That is, the potentials of the bit lines are clamped at a level which is hereinafter referred to as a clamp level. Here, it should be noted that the clamp level must be designed to be lower than the potential value for preventing the write current from being decreased and higher than the potential value for preventing the nonselected memory cell from being disturbed. In addition, the deviation of the clamp level is dependent upon the characteristics of the clamp circuit, while the deviations of the two limit values are dependent upon the fluctuation of characteristics of the memory cells induced by manufacturing processes.

However, in the above-mentioned device, since the elements of the clamp circuit are quite different from those of the memory cells, the deviation of the clamp level induced by manufacturing processes and temperature fluctuation is different from those of the two limit values. As a result, if it happens that the clamp level deviates from a range between the two limit values which is relatively small, then the device cannot be reliably operated.

SUMMARY OF THE INVENTION

It is an object of the present invention to provide a semiconductor integrated circuit device of an I²L type capable of being reliably operated.

According to the present invention, there is provided a semiconductor integrated circuit device comprising: a plurality of word lines; a plurality of word drivers, each connected to one of the word lines; a plurality of hold lines; a plurality of pairs of bit lines; a plurality of bit drivers, each connected to one of the pairs of bit lines; a plurality of memory cells of integrated injection logic, each connected to one of the word lines, to one of the hold lines and to one of the pair of bit lines; and a bit line clamp circuit connected between the pairs of bit lines and a reference power supply, the clamp circuit comprising at least one dummy cell for which the fluctuation of characteristics induced by manufacturing processes of which are relative to those of the memory cells, whereby a reference voltage of the reference power supply, minus a voltage drop due to the clamp circuit, is applied to the bit lines. In this device, a clamp level changes in response to changes of an upper limit value or a lower limit value. Therefore, when the clamp circuit is so designed that the clamp level is in proximity to the upper or lower limit value, the clamp level scarcely deviates from a range between the two limit values, so that the device can be reliably operated.

BRIEF DESCRIPTION OF THE DRAWINGS

The present invention will be more clearly understood from the description as set forth below with reference to the accompanying drawings, wherein.

DESCRIPTION OF THE PREFERRED EMBODIMENTS

Figure 1A:
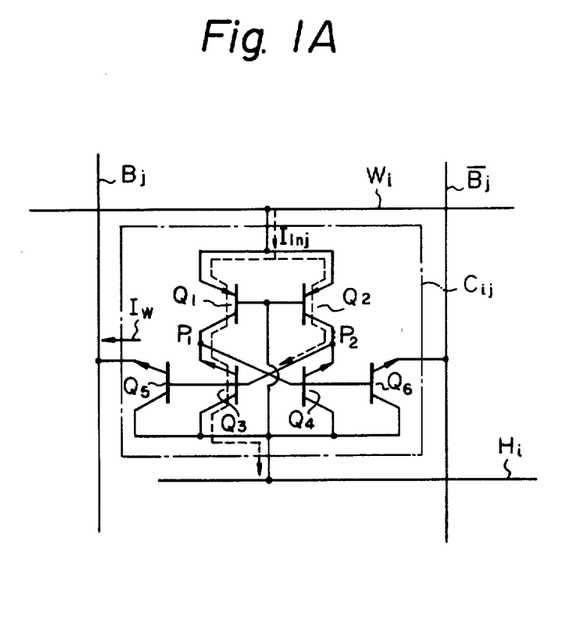
FIG. 1A is a circuit diagram illustrating an equivalent circuit of one I²L memory cell.

Referring to FIG. 1A, which illustrates an equivalent circuit of one I²L memory cell, a memory cell $C_{ij}$ comprises a pair of transistors $Q_1$ and $Q_2$ of a pnp type which serve as injectors, a pair of transistors $Q_3$ and $Q_4$ of an npn type which are cross-coupled to each other and serve as a flip-flop, and a pair of transistors $Q_5$ and $Q_6$ of an npn type for detecting and reversing the state of the flip-flop in the read-out and write modes, respectively. The transistors $Q_1$ and $Q_2$ have a common emitter connected to a word line $W_i$ and collectors connected to collectors (which are represented as emitters in FIG. 1) of the transistors $Q_3$ and $Q_4$, respectively. The bases of the transistors $Q_1$ and $Q_2$, the emitters of the transistors $Q_3$ and $Q_4$, and the collectors of the transistors $Q_5$ and $Q_6$ are connected to a common hold line $H_i$ which is also called a word line. In addition, the emitters of the transistors $Q_5$ and $Q_6$ are connected to bit lines $B_j$ and $\bar{B}_j$, respectively.

The selection of the memory cell $C_{ij}$ is effected by raising the potential of the word line $W_i$ and by connecting the bit lines $B_j$ and $\bar{B}_j$ to data bit lines (not shown), to which current source (not shown) are connected. The transistors $Q_3$ and $Q_4$ are in the reverse conducting mode, regardless of the selected or non-selected state of the memory cell $C_{ij}$. Contrary to this, the transistors $Q_5$ and $Q_6$ are in the forward conducting mode during the selected state of the memory cell $C_{ij}$, while the transistors $Q_5$ and $Q_6$ are in the reverse conducting mode during the non-selected state of the memory cell $C_{ij}$.

In FIG. 1A, the transistors $Q_3$ and $Q_4$ are placed in the on- and off-state alternately. For example, when the transistor $Q_3$ is conductive, an injection current $I_{inj}$ is supplied to the transistor $Q_3$ as a base current and a collector current through the transistors $Q_2$ and $Q_1$, respectively. As a result, the transistor $Q_3$ is in a saturated state, so that the potential at a node $P_1$ is low and, accordingly, the transistor $Q_4$ is non-conductive. In order to change the information stored in the memory cell $C_{ij}$, the transistor $Q_3$ should be changed from conductive to non-conductive. This is done by supplying a write current $I_w$ larger than a write threshold current $I_{wth}$ to the emitter of the transistor $Q_5$, so that the base of the transistor $Q_5$ absorbs the base current of the transistor $Q_3$. As a result, the transistor $Q_3$ is changed from a saturated state to a non-saturated state, so that the potential at the node $P_1$ becomes high. Therefore, the transistor $Q_4$ becomes conductive and the potential at the node $P_2$ becomes low, so that the transistor $Q_3$ becomes non-conductive. That is, the state of the flip-flop formed by the transistors $Q_3$ and $Q_4$ is reversed.

In the above-mentioned write mode, the write threshold current $I_{wth}$ depends on the injection current $I_{inj}$. Therefore, the write threshold current $I_{wth}$ is large where the injection current $I_{inj}$ is large.

Figure 1B:
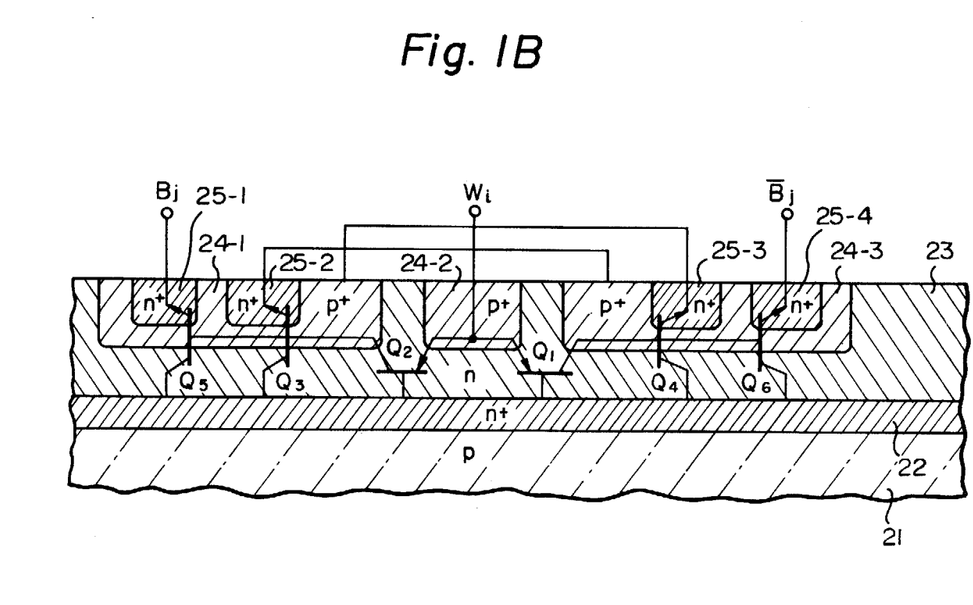
FIG. 1B is a cross-sectional view of the I²L memory cell of FIG. 1A.

FIG. 1B is a cross-sectional view of the I²L memory cell of FIG. 1A. In FIG. 1B, an $n^+$-type buried layer 22, which serves as the hold line $H_i$ (FIG. 1), is formed in a p-type substrate 21 by using conventional diffusion technology. In addition, an n-type epitaxial layer 23 is formed on the buried layer 22 by using epitaxial technology. Further, in the epitaxial layer 23, $P^+$-type diffusion layers 24-1, 24-2 and 24-3 are formed, and in addition, in the $p^+$-type diffusion layers 24-1 and 24-3, $n^+$-type diffusion layers 25-1, 25-2, 25-3, 25-4 are formed by using conventional diffusion technology. As illustrated in FIG. 1B, the injection transistors $Q_1$ and $Q_2$ are of a lateral type, while the transistors $Q_3$ and $Q_5$ (and $Q_4$ and $Q_6$) are formed by one vertical transistor with multiple collectors. In the memory cell of FIG. 1B, it should be noted that there is no resistor having high resistance and no isolation between the transistors $Q_1$ through $Q_6$, so that the density of the memory cells is high.

Next, sink currents flowing into non-selected memory cells are explained.

Figure 2:
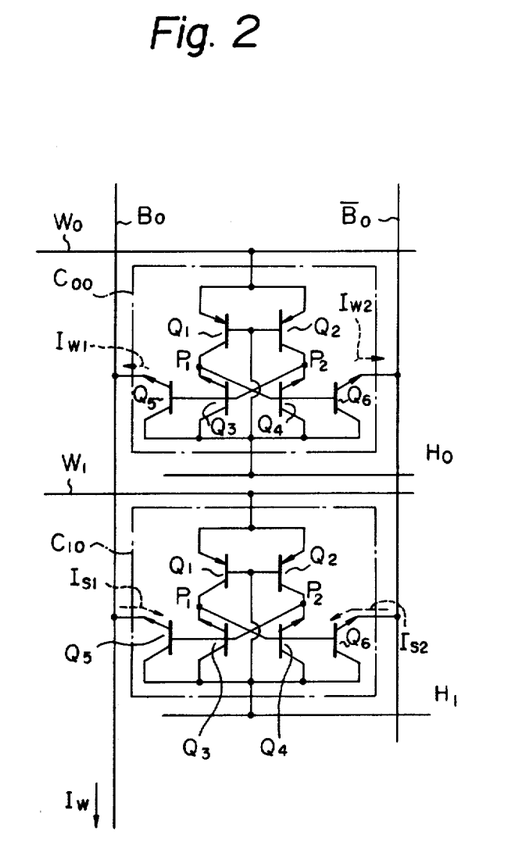
FIG. 2 is a circuit diagram of two I²L memory cells of FIG. 1A.

FIG. 2 is a circuit diagram of two I²L memory cells of FIG. 1A which are arranged in a one-column array. In FIG. 2, when memory cell $C_{00}$ is selected and other memory cells $C_{01}$ (not shown), $C_{10}$ and $C_{11}$ (not shown) are non-selected, in other words, when the potentials of word lines $W_0$ and $W_1$ are high and low, respectively, the potentials of hold lines $H_0$ and $H_1$ are high and low, respectively.

In addition, when the transistors $Q_3$ of the cells $C_{00}$ and $C_{10}$ are conductive, the transistors $Q_5$ of the cells $C_{00}$ and $C_{10}$ are conductive. In this case, the transistor $Q_5$ of the cell $C_{00}$ is in the forward conducting mode, while the transistor $Q_5$ of the cell $C_{10}$ is in the reverse conducting mode. Therefore, a current $I_{W1}$ which is a part of an injection current $I_{inj}$ flows from the transistor $Q_5$ of the cell $C_{00}$ to a bit line $B_0$, while a sink current $I_{S1}$ flows from the bit line $B_0$ through the transistor $Q_5$ of the cell $C_{10}$ to the hold line $H_1$. If the current $I_{W1}$ serves as a write current, the sink current $I_{S1}$ increases the current $I_{W1}$ so that the speed of write operation becomes high.

Contrary to the above, in the non-selected cell $C_{10}$, when the transistors $Q_5$ and $Q_6$ are non-conductive and conductive, respectively, a sink current $I_{S2}$ flows from a bit line $\bar{B}_0$ through the transistor $Q_6$ of the cell $C_{10}$ to the hold line $H_1$. In this case, the transistor $Q_6$ of the cell $C_{00}$ is in the forward conducting mode, and therefore, a current $I_{W2}$ flows from the transistor $Q_6$ to a bit line $\bar{B}_0$, while a write current $I_{W1}$ is sunk from the transistor $Q_5$ of the cell $C_{00}$, so that the injection current $I_{inj}$ of the cell $C_{00}$ is increased. As a result, the write threshold current $I_{wth}$, which depends on the injection current $I_{inj}$, is also increased, and therefore, the speed of the write operation becomes low.

Figure 3:
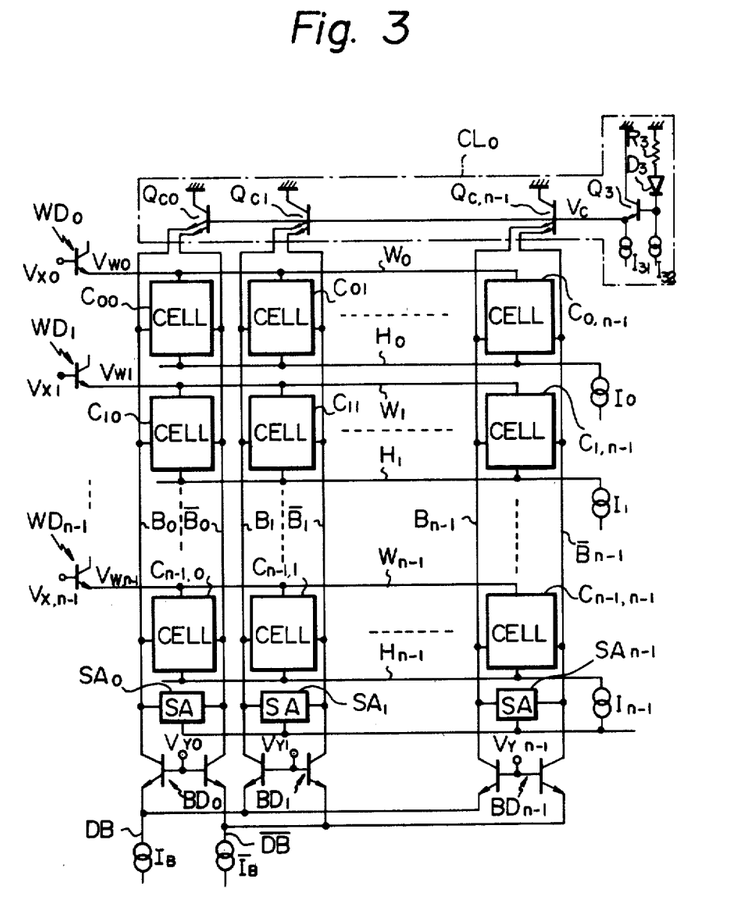
FIG. 3 is a block diagram illustrating a conventional I²L memory device.

FIG. 3 is a block diagram illustrating a conventional I²L memory device. In FIG. 3, a memory array which is comprised of memory cells $C_{ij}$ (i, j=0, 1, ..., n−1), which are arranged in an n row, n column matrix, is shown. Each of the memory cells $C_{ij}$ can be selected by supplying row selection signals $V_{X0}$ through $V_{X,n-1}$ to word decoders $WD_0$ through $WD_{n-1}$ and by supplying column selection signals $V_{Y0}$ through $V_{Y,n-1}$ to bit drivers $BD_0$ through $BD_{n-1}$. Sensing amplifiers indicated by the references $SA_0, \ldots, SA_{n-1}$ detect the data stored in the memory cells.

In the above-mentioned device, a bit line clamp circuit $CL_0$ is provided so as to supply sink currents into non-selected memory cells. Therefore, an injection current in a selected memory cell can be stable. For example, when the potentials of only the signals $V_{X0}$ and $V_{Y0}$ are high, the memory cell $C_{00}$ is selected. In addition, the other memory cells are non-selected. A clamp voltage $V_C$ of the clamp circuit $CL_0$ should be determined between two values which are explained below.

Figure 4:
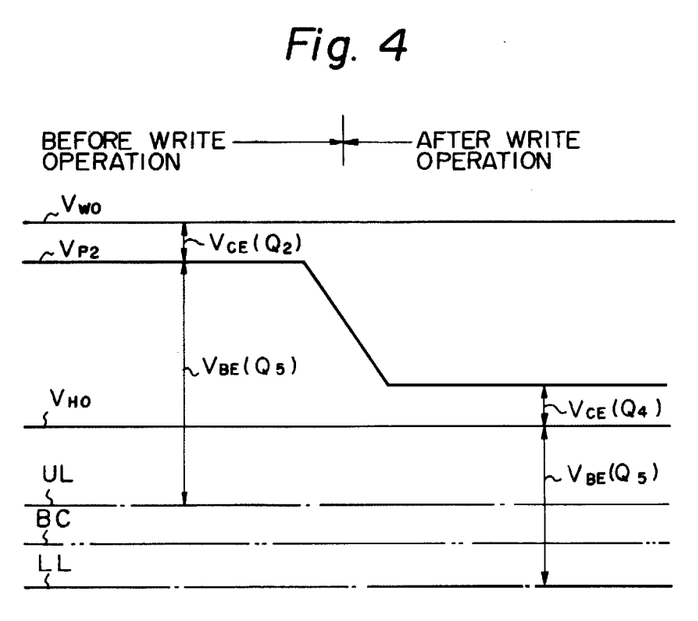
FIG. 4 is a diagram showing the potential levels, for explaining the value of the clamp potential of the bit lines of FIG. 3.

FIG. 4 is a diagram showing the potential levels, for explaining the value of the clamp potential of the bit lines of FIG. 3. In FIG. 4, $V_{W0}$ and $V_{H0}$ indicate the potentials of the word line $W_0$ and the hold line $H_0$, respectively, of the selected memory cell $C_{00}$ and $V_{P2}$ indicates the potential at the node $P_2$ of the selected memory cell $C_{00}$ (see, FIG. 1). Now, it is assumed that the transistors $Q_3$ and $Q_4$ are conductive and non-conductive, respectively.

Before a write operation for the selected cell $C_{00}$, the potential $V_{P2}$ at the node $P_2$ is represented by $$V_{P2} = V_{W0} - V_{CE}(Q_2)$$

where $V_{CE}(Q_2)$ is a collector-emitter voltage of the transistor $Q_2$. In addition, the potential $V_{B0}$ of the bit line $B_0$ is represented by $$V_{B0} (= UL) = V_{P2} - V_{BE}(Q_5) \quad (1)$$
$$= V_{W0} - V_{CE}(Q_2) - V_{BE}(Q_5)$$

where $V_{BE}(Q_5)$ is a base-emitter voltage of the transistor $Q_5$.

On the other hand, after a write operation for the selected cell $C_{00}$, that is, after the transistors $Q_3$ and $Q_4$ become non-conductive and conductive, respectively, the potential $V_{P2}$ at the node $P_2$ becomes low as illustrated in FIG. 4. In this case, the potential $V_{P2}$ is represented by $$V_{P2} = V_{H0} + V_{CE}(Q_4).$$

where $V_{CE}(Q_4)$ is a collector-emitter voltage of the transistor $Q_4$. In addition, the potential $V_{B0}$ of the bit line $B_0$ is represented by $$V_{B0} (= LL) = V_{P2} - V_{BE}(Q_5) \quad (2)$$
$$= V_{H0} + V_{CE}(Q_4) - V_{BE}(Q_5)$$

The potentials of the bit lines must be between two limit values, that is, an upper limit value UL represented by the formula (1) and a lower limit value LL represented by the formula (2). This is because, when the potentials of the bit lines become higher than the upper limit value UL, a write current $I_W$ for the selected cell is decreased which facilitates a low speed in the write operation. Contrary to this, when the potentials of the bit lines become lower than the lower limit value LL, even after a write operation, the detecting transistor $Q_5$ or $Q_6$ of the selected cell again conducts so that information is rewritten. It should be noted that the limit values UL and LL are effected mainly by the lateral transistor $Q_2$ ($Q_1$) in the forward conducting mode and the vertical transistor $Q_5$ ($Q_6$) in the reverse conducting mode.

Returning to FIG. 3, the clamp circuit $CL_0$ comprises clamp transistors $Q_{C0}, Q_{C1}, \ldots, Q_{C,n-1}$ having emitters connected to the bit lines $B_0, \bar{B}_0, B_1, \bar{B}_1, \ldots, B_{n-1}, \bar{B}_{n-1}$ and bases receiving a clamp voltage $V_C$ so that the potentials of the bit lines are clamped at a bit line clamp level BC between the two limit values UL and LL as illustrated in FIG. 4. The clamp voltage $V_C$ is determined by a circuit comprised of a resistor $R_3$, a diode $D_3$, a transistor $Q_3$ and current sources $I_{31}$ and $I_{32}$. In this case, the clamp voltage $V_C$ is affected mainly by the vertical transistor $Q_3$ in the forward conducting mode. Therefore, since the elements of the clamp circuit $CL_0$ are quite different from those of the memory cells, the deviation of the bit line clamp level BC is different from those of the two limit values UL and LL due to manufacturing processes or temperature fluctuation. As a result, it happens that the clamp level BC deviates behind the range between the two limit values UL and LL so that the memory device cannot be reliably operated.

Contrary to the above, elements of the bit line clamp circuit according to the present invention are similar to those of the memory cells. Therefore, even when a difference due to manufacturing processes is generated or a temperature fluctuation is generated during the operation, the clamp level BL of the bit lines changes relative to the changes of the upper limit value UL or the lower limit value LL. Therefore, the clamp value BC does not deviate beyond the range between the two limit values.

Figure 5A:
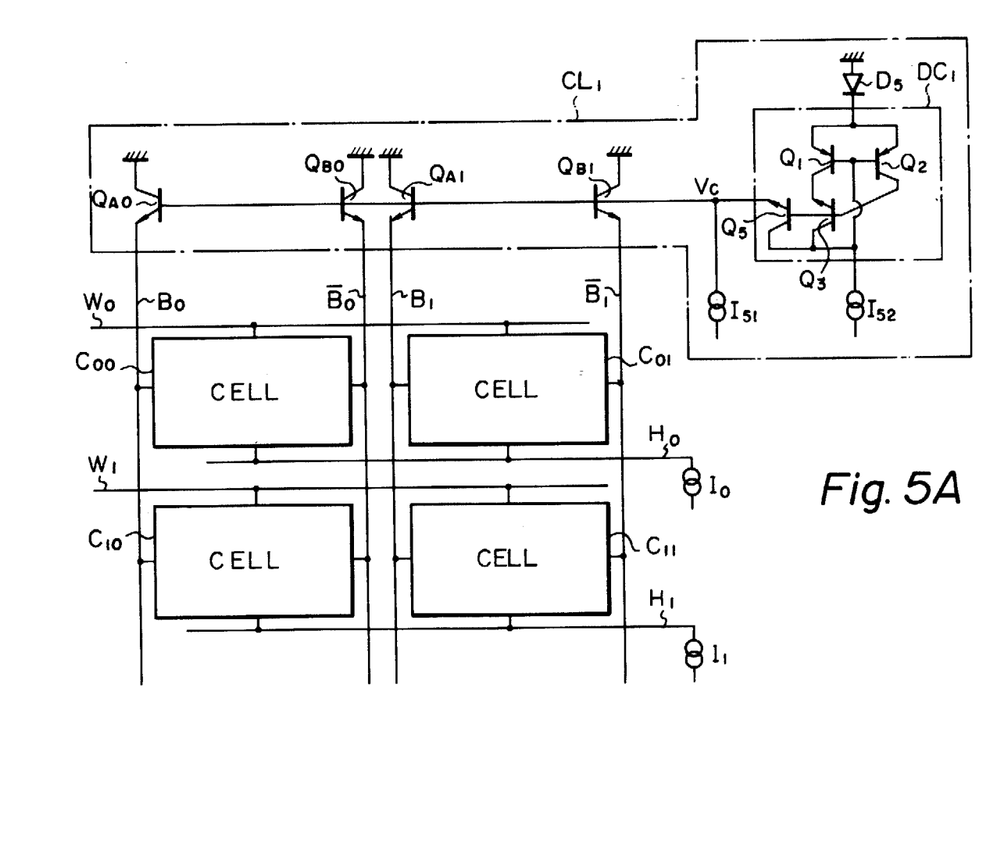
FIGS. 5A, 6A, 7A and 8A are circuit diagrams illustrating first, second, third and fourth embodiments of the I²L memory device according to the present invention, respectively.

FIG. 5A is a circuit diagram illustrating a first embodiment of the I²L memory device according to the present invention. In FIG. 5A, the memory cells $C_{00}, C_{01}, C_{10}$ and $C_{11}$, which are arranged in a two-row, two column matrix, are shown. A bit line clamp circuit $CL_1$ comprises clamp transistors $Q_{A0}, Q_{B0}, Q_{A1}$ and $Q_{B1}$ having emitters connected to the bit lines $B_0, \bar{B}_0, B_1$ and $\bar{B}_1$, respectively, and having bases receiving a clamp voltage $V_C$. The clamp voltage $V_C$ is generated from a dummy cell $DC_1$ which is connected to a diode $D_5$ and current sources $I_{51}$ and $I_{52}$. As understood from FIGS. 1A and 5A, the elements of the dummy cell $DC_1$ are the same as those of the memory cell $C_{ij}$ except for the transistors $Q_4$ and $Q_6$. In the dummy cell $DC_1$, it should be noted that the transistor $Q_3$ is always conductive. That is, the clamp voltage $V_C$ changes relative to changes of the upper limit value UL. Therefore, when the clamp circuit $CL_1$ is so designed that the clamp level BC of the bit lines is in proximity to and under the upper limit value UL, an effective range between the two limit values becomes large.

Figure 5B:
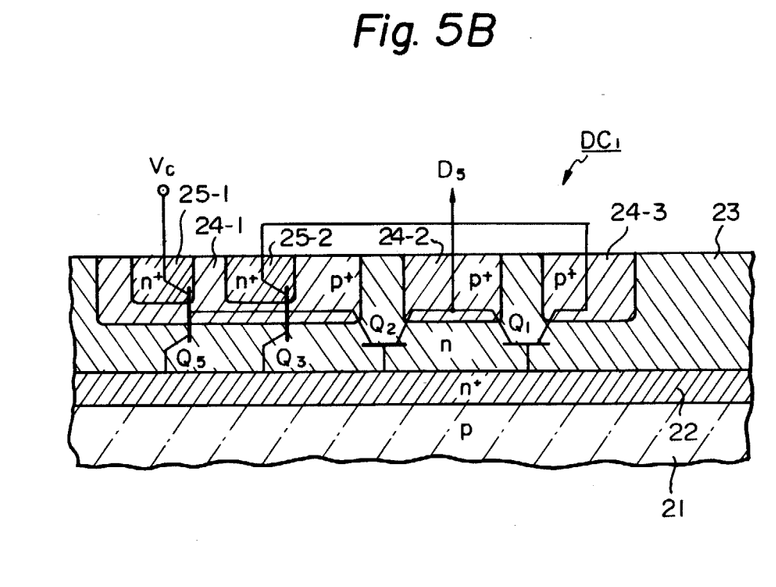
FIGS. 5B, 6B, 7B and 8B are cross-sectional views of the dummy cells $DC_1$, $DC_2$, $DC_3$ and $DC_4$ of FIGS. 5A, 6A, 7A and 8A, respectively.

FIG. 5B is a cross-sectional view of the dummy cell $DC_1$ of FIG. 5A. As illustrated in FIG. 5B, the dummy cell $DC_1$ is the same as the memory cell of FIG. 1B, except for the n⁺-type diffusion layers 25-3 and 25-4. Therefore, the dummy cell $DC_1$ can be manufactured together with the memory cells.

Figure 6A:
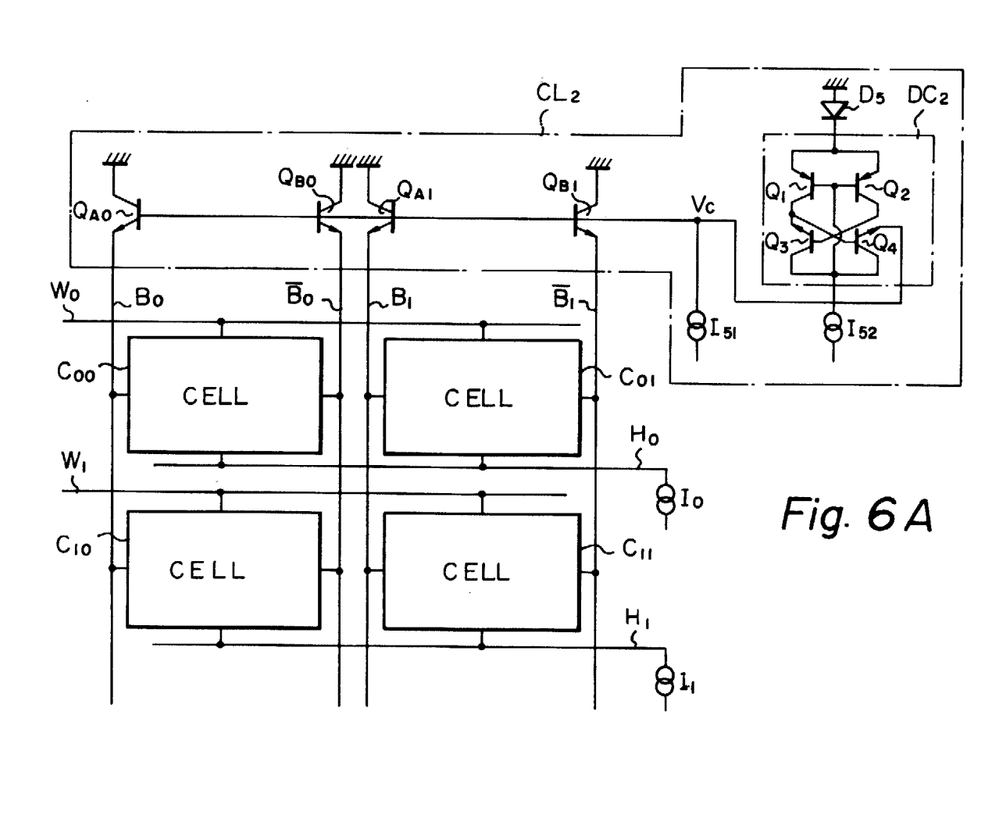

FIG. 6A is a circuit diagram illustrating a second embodiment of the I²L memory device according to the present invention. In FIG. 6A, the elements which are the same as those of FIG. 5A are denoted by the same references. That is, a dummy cell $DC_2$ is different from the dummy cell $DC_1$ of FIG. 5A. As understood from FIGS. 1A and 6A, elements of the dummy cell $DC_2$ are the same as those of the memory cell $C_{ij}$ of FIG. 1A except for the transistors $Q_5$ and $Q_6$. In the dummy cell $DC_2$, the collector of the transistor $Q_2$ is not connected to the collector (which is represented as an emitter) of the transistor $Q_4$. As a result, the transistors $Q_3$ and $Q_4$ are always conductive and non-conductive, respectively. That is, the clamp voltage $V_C$ changes relative to the changes of the lower limit value LL. Therefore, when the clamp level BC of the bit lines is in proximity to and over the lower limit value LL, an effective range between the two limit values becomes large.

Figure 6B:
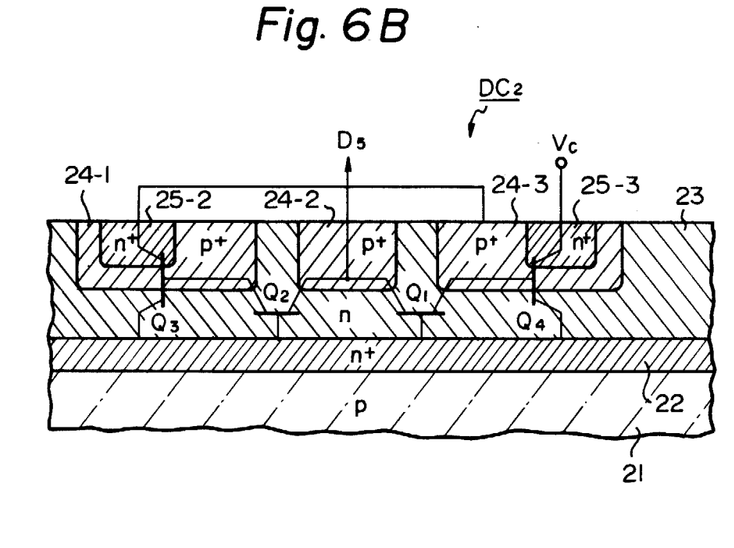

FIG. 6B is a cross-sectional view of the dummy cell $DC_2$ of FIG. 6A. As illustrated in FIG. 6B, the dummy cell $DC_2$ is the same as the memory cell of FIG. 1B, except for the n+-type diffusion layers 25-1 and 25-4. Therefore, the dummy cell $DC_2$ can be manufactured together with the memory cells.

Figure 7A:
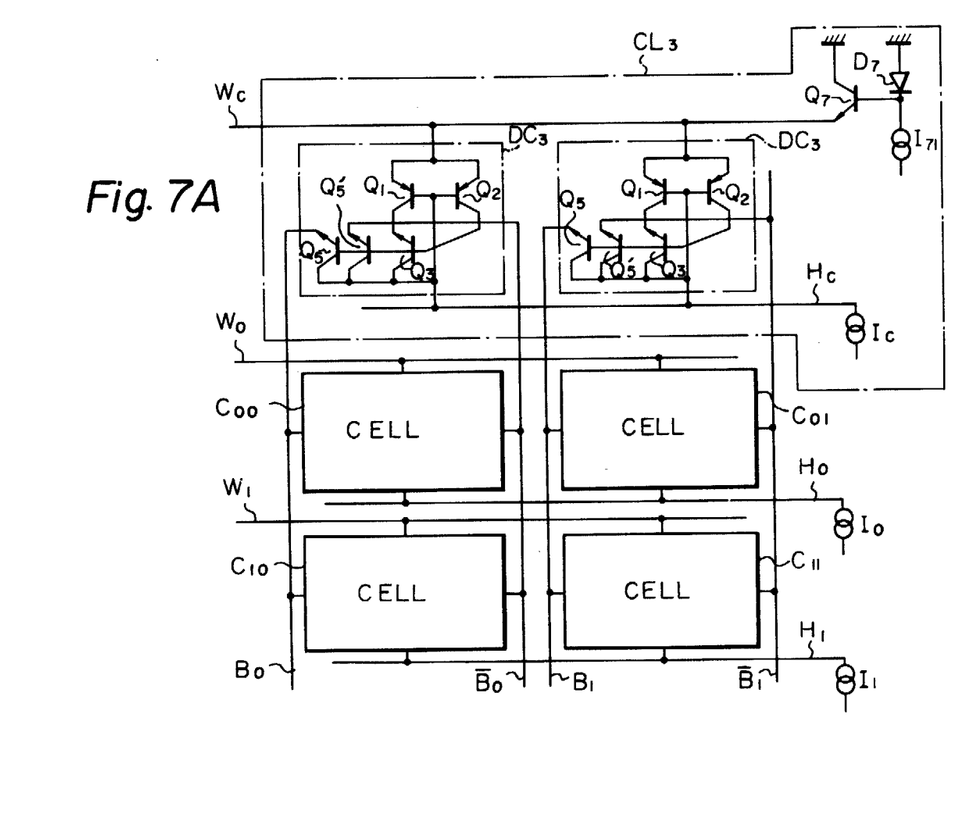

FIG. 7A is a circuit diagram illustrating a third embodiment of the I²L memory device according to the present invention. As illustrated in FIG. 7A, a bit line clamp circuit $CL_3$ comprises two dummy cells $DC_3$ connected to each pair of the bit lines $B_0$, $\bar{B}_0$ and $B_1$, $\bar{B}_1$. The two dummy cells $DC_3$ are arranged between two lines $W_C$ and $H_C$. The line $W_C$ is connected to a circuit comprised of a transistor $Q_7$, a diode $D_7$ and a current source $I_{71}$, while the line $H_C$ is connected to a current source $I_C$.

Each of the dummy cells $DC_3$ is the same as the dummy cell $DC_1$ except for an additional transistor $Q_5'$. In the dummy cells $DC_3$, the transistor $Q_3$ is also always conductive. That is, output voltages of the transistors $Q_5$ and $Q_5'$ change relative to changes of the upper limit value UL. Therefore, when the clamp circuit $CL_3$ is so designed that the clamp level BC, which is one of the output voltages of the dummy cell $DC_3$, is in proximity to and under the upper limit value UL, an effective range between the two limit values becomes large.

In addition, in the memory device of FIG. 7A, since the lines $W_C$ and $H_C$, the current source $I_C$ and the dummy cells $DC_3$ are arranged as a word line, a hold line and, a current source for usual memory cells, respectively, potential gradients which exist along the word lines of the usual memory cells can be completely compensated.

Figure 7B:
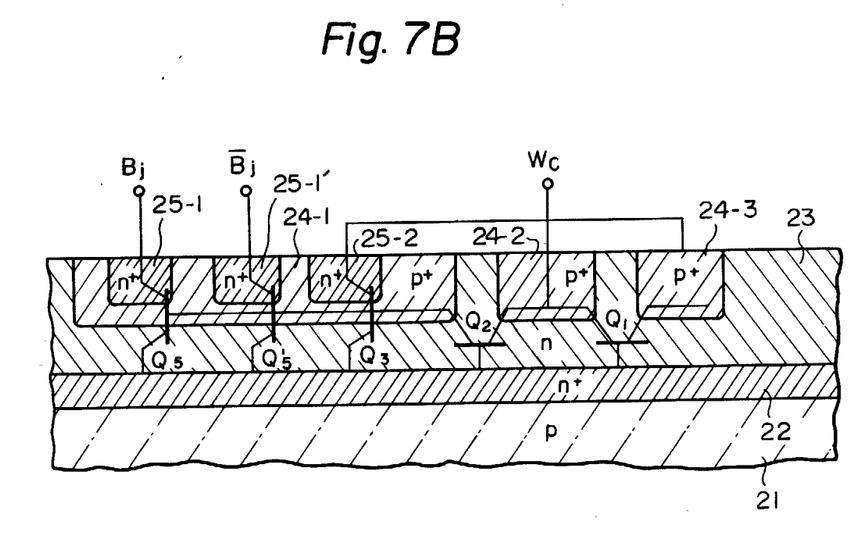

FIG. 7B is a cross-sectional view of the dummy cell $DC_3$ of FIG. 7A. As illustrated in FIG. 7B, the dummy cell $DC_3$ is the same as the memory cell of FIG. 1B, except for the n+-diffusion layers 25-3 and 25-4. In addition, an n+-diffusion layer 25-1' for the transistor $Q_5'$ is provided in the p+-type diffusion layer 24-1. Therefore, the dummy cell $DC_3$ can be incorporated with the I²L memory cells.

Figure 8A:
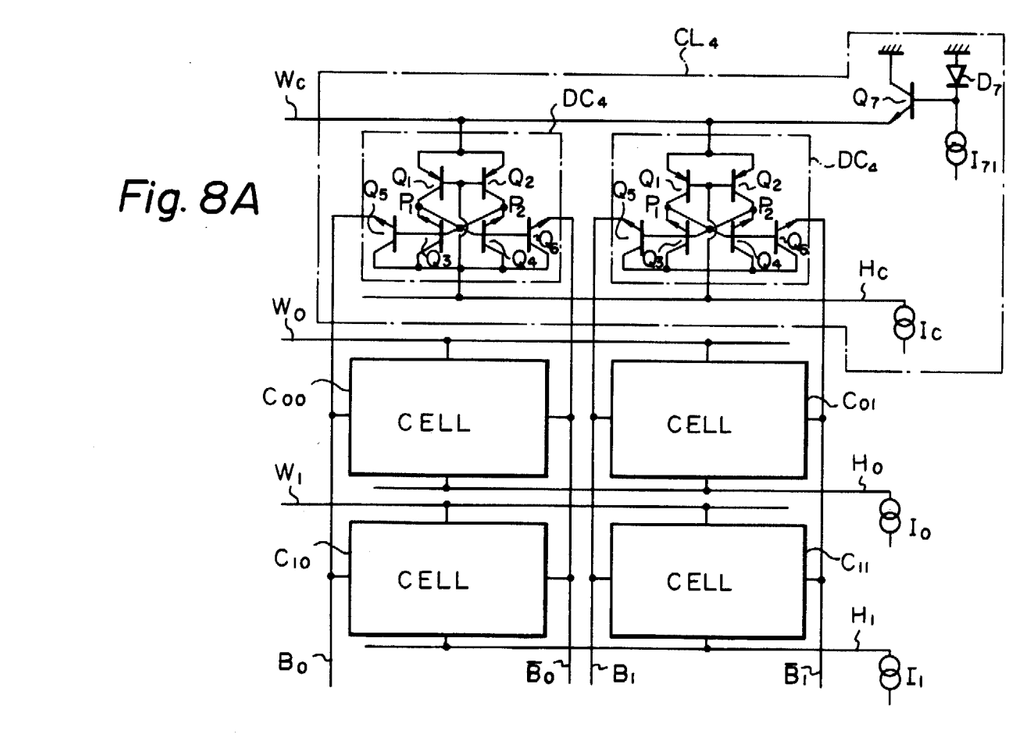

FIG. 8A is a circuit diagram illustrating a fourth embodiment of the I²L memory device according to the present invention. In FIG. 8A, the elements which are the same as those of FIG. 7A are denoted by the same references. That is, dummy cells $DC_4$ are different from the dummy cells $DC_3$ of FIG. 7A. Each of the dummy cells $DC_4$ is the same as the memory cell $C_{ij}$ of FIG. 1A, except that connections for cross-coupling the transistors $Q_3$ and $Q_4$ are electrically shorted. As a result, in the dummy cell $DC_4$, both of the transistors $Q_3$ and $Q_4$ are conductive. Therefore, the transistor $Q_4$ of FIG. 8A serves as the transistor $Q_3$ of FIG. 7A, and the transistor $Q_6$ of FIG. 8A serves as the transistor $Q_5'$ of FIG. 7A. In other words, the characteristics of the dummy cell $DC_4$ of FIG. 8A are almost the same as those of the dummy cell $DC_3$ of FIG. 7A.

Figure 8B:
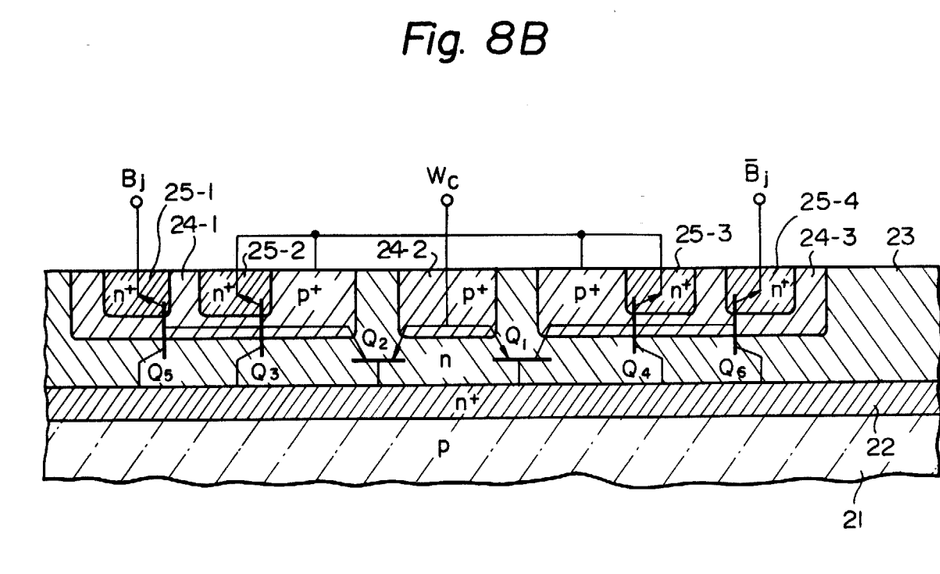

FIG. 8B is a cross-sectional view of the dummy cell $DC_4$ of FIG. 8A. As illustrated in FIG. 8B, the dummy cell $DC_4$ is the same as the memory cell of FIG. 1B, except for connections. Therefore, the dummy cell $DC_4$ can be incorporated with the memory cells.

As explained hereinabove, the I²L memory device according to the present invention has an advantage, as compared with the conventional device, in that the device can be reliably operated, since the device is provided with a bit line clamp circuit the output levels of which are in response to the change in an upper limit value or a lower limit value. For example, if the clamp circuit is in response to the change of the upper limit value, the clamp circuit is so designed that the clamp potentials of the bit lines are in proximity to and under the upper limit value. Contrary to this, if the clamp circuit is in response to changes of the lower limit value, the clamp circuit is so designed that the clamp potentials of the bit lines are in proximity to and over the lower limit value. As a result, the potentials of the bit lines scarcely deviate from the range between the two limit values.

We claim:

1. A semiconductor integrated circuit device comprising:
   a plurality of word lines;
   a plurality of word drivers, each said word driver being connected to one of said word lines;
   a plurality of hold lines;
   a plurality of pairs of bit lines;
   a plurality of bit drivers, each said bit driver being connected to one of said pairs of bit lines;
   a plurality of memory cells of integrated injection logic, each said memory cell being operatively connected to one of said plurality of word lines, to one of said plurality of hold lines and to one of said plurality of pairs of bit lines; and
   a bit line clamp circuit operatively connected between said pairs of bit lines and a reference power supply, said clamp circuit comprising at least one dummy cell, any fluctuation of characteristics induced in each said dummy cell by manufacturing processes correspond to those of each said memory cell, so that a reference voltage of said reference power supply minus a voltage drop due to said bit line clamp circuit is applied to said plurality of pairs of bit lines.

2. A device according to claim 1, wherein each of said memory cells comprises:
   injectors comprising a pair of first and second transistors of a first conduction type having a common emitter connected to one of said plurality of word lines;
   a flip-flop comprising a pair of cross-coupled third and fourth transistors of a second conduction type, operatively connected to said first and second transistors;
   a pair of fifth and sixth transistors, operatively connected in parallel to said third and fourth transistors, respectively, and to one of said plurality of pairs of bit lines and
   said third, fourth, fifth and sixth transistors being operatively connected to one of plurality of said hold lines.

3. A device according to claim 1, wherein said clamp circuit comprises one said dummy cell, said clamp circuit further comprising:
   a plurality of clamp transistors, each said clamp transistor having an emitter connected to one of said plurality of bit lines, a base operatively connected to said one dummy cell and a collector connected to said reference power supply;
   a first current source operatively connected to said bases of said plurality of clamp transistors and to said one dummy cell; and
   a second current source operatively connected to said one dummy cell.

4. A device according to claim 3, wherein said one dummy cell comprises:
   injectors comprising a pair of seventh and eighth transistors of a first conduction type having a common emitter connected to said reference power supply;
   a ninth transistor of a second conduction type, operatively connected to said seventh and eighth transistors and to said second current source, said ninth transistor always being conductive during operation; and
   a tenth transistor of said second conduction type operatively connected in parallel to said ninth transistor and operatively connected to said clamp transistors.

5. A device according to claim 3, wherein said dummy cell comprises:
   injectors comprising a pair of seventh and eighth transistors of a first conduction type having a common emitter connected to said reference power supply;
   a flip-flop comprising a pair of ninth and tenth transistors of a second conduction type operatively connected to said second current source; and
   said ninth transistor being operatively connected to said seventh and eighth transistors, said tenth transistor being operatively connected to said seventh transistor and to said clamp transistors, said ninth and tenth transistors always being conductive and non-conductive, respectively, during operation.

6. A device according to claim 1, wherein the number of said dummy cells is equal to that of said pairs of bit lines, each of said dummy cells being connected to one of said pairs of bit lines.

7. A device according to claim 6, wherein each of said dummy cells comprises:
   injectors comprising a pair of seventh and eighth transistors of a first conduction type having a common emitter;
   a ninth transistor of a second conduction type, operatively connected to said seventh and eighth transistors, whereby said ninth transistor is always conductive during operation; and
   tenth and eleventh transistors of said second conduction type, each operatively connected in parallel to said ninth transistor and to one of said bit lines.

8. A device according to claim 6, wherein each of said dummy cells comprises:
   injectors comprising a pair of seventh and eighth transistors of a first conduction type having a common emitter;
   ninth and tenth transistors of a second conduction type operatively cross-coupled to each other, operatively connected to said seventh and eighth transistors, the connections for cross-coupling said ninth and tenth transistors being shorted, said ninth and tenth transistors always being conductive during operation; and
   a pair of eleventh and twelfth transistors, operatively connected in parallel to said ninth and tenth transistors, respectively, and each being operatively connected to one of said bit lines.

9. A device according to claim 2, 4, 5, 6 or 8, wherein said transistors of said first conduction type are lateral pnp transistors, and said transistors of said second conduction type are vertical npn transistors.

10. A device according to claim 1, 2, 3, 5, 7 or 8 wherein said device is partially formed of a construction comprising:
   a p-type substrate;
   an n+-type epitaxial layer formed on said p-type substrate;
   an n-type epitaxial layer formed on said n+-type epitaxial layer;
   a plurality of p+-type diffused regions formed in said n-type epitaxial layer; and
   a plurality of n+-type diffused regions formed within said p+-type diffused regions;
   each said dummy cell having fluctuations of characteristics induced by manufacturing processes relative to the fluctuations of characteristics of said corresponding memory cell.

11. The device of claim 10, wherein said dummy cells and said corresponding memory cells are formed on the same said substrate.

* * * * *